United States Patent
Chen et al.

(10) Patent No.: US 7,554,819 B2
(45) Date of Patent: Jun. 30, 2009

(54) CABLE MANAGEMENT ARM ASSEMBLY

(75) Inventors: Ken-Ching Chen, Kaohsiung Hsien (TW); Shih-Long Hwang, Kaohsiung Hsien (TW); Shun-Ho Yang, Kaohsiung Hsien (TW); Chun-Chiang Wang, Kaohsiung Hsien (TW)

(73) Assignee: King Slide Works Co., Ltd., Kaohsiung Hsien (TW)

( * ) Notice: Subject to any disclaimer, the term of this patent is extended or adjusted under 35 U.S.C. 154(b) by 711 days.

(21) Appl. No.: 11/334,509

(22) Filed: Jan. 19, 2006

(65) Prior Publication Data

US 2006/0113433 A1 Jun. 1, 2006

Related U.S. Application Data

(63) Continuation-in-part of application No. 11/014,976, filed on Dec. 20, 2004, which is a continuation-in-part of application No. 10/964,708, filed on Oct. 15, 2004.

(30) Foreign Application Priority Data

Apr. 19, 2005 (TW) .............................. 94112504 A

(51) Int. Cl.
*H02B 1/20* (2006.01)
(52) U.S. Cl. .................... 361/826; 361/727; 361/756
(58) Field of Classification Search ................ 361/826, 361/683, 727, 829, 756, 741, 686, 802; 312/223; 211/26, 175, 189
See application file for complete search history.

(56) References Cited

U.S. PATENT DOCUMENTS

| | | | |
|---|---|---|---|
| 3,710,199 A | 1/1973 | Cignoni, Jr. | |
| 4,353,518 A | 10/1982 | Tylor et al. | |
| 4,614,383 A | 9/1986 | Polley et al. | |
| 5,460,441 A | 10/1995 | Hastings et al. | |
| 5,571,256 A | 11/1996 | Good et al. | |
| 5,893,539 A | 4/1999 | Tran et al. | |
| 5,921,402 A | 7/1999 | Magenheimer | |
| 6,070,742 A | 6/2000 | McAnally et al. | |
| 6,215,069 B1 | 4/2001 | Martin et al. | |
| 6,303,864 B1 | 10/2001 | Johnson et al. | |
| 6,305,556 B1 | 10/2001 | Mayer | |
| 6,326,547 B1 | 12/2001 | Saxby et al. | |
| 6,327,139 B1 | 12/2001 | Champion et al. | |

(Continued)

FOREIGN PATENT DOCUMENTS

DE 202004019451 U1 3/2005

*Primary Examiner*—Hung S Bui
(74) *Attorney, Agent, or Firm*—Rosenberg, Klein & Lee

(57) ABSTRACT

A cable management arm assembly includes a frame, a support rail, a first and a second sliding members, a first and a second connectors, and an insertion socket operating in conjunction with slides. The frame slides on the support rail with both ends connected to the insertion socket and the first connector. The sliding members are respectively mounted in the connectors. A locking member is disposed on each of the connectors and the insertion socket to secure them to the slides. A limiting member is provided on the first connector connected to the frame to retain and release the first sliding member, and the limiting member is pushed when the first connector is inserted into the rear end of the outer rail to release the first sliding member for the support rail to move when the slides extend and the front and the rear arms of the frame unfold.

23 Claims, 11 Drawing Sheets

U.S. PATENT DOCUMENTS

| | | |
|---|---|---|
| 6,435,354 B1 | 8/2002 | Gray et al. |
| 6,442,030 B1 | 8/2002 | Mammoser et al. |
| 6,501,020 B2 | 12/2002 | Grant et al. |
| 6,523,918 B1 | 2/2003 | Baiza |
| 6,600,665 B2 | 7/2003 | Lauchner |
| 6,646,893 B1 | 11/2003 | Hardt et al. |
| 6,715,718 B1 | 4/2004 | Chen et al. |
| 6,747,874 B2 * | 6/2004 | McKinnon et al. .......... 361/724 |
| 6,805,248 B2 | 10/2004 | Champion et al. |
| 6,811,039 B2 | 11/2004 | Chen et al. |
| 6,854,605 B2 | 2/2005 | Wrycraft |
| 6,856,505 B1 | 2/2005 | Venegas et al. |
| 6,867,980 B2 | 3/2005 | Wrycraft |
| 6,896,344 B2 | 5/2005 | Tsutsumi et al. |
| 6,902,069 B2 | 6/2005 | Hartman et al. |
| 6,945,504 B2 | 9/2005 | Chen et al. |
| 7,009,112 B1 * | 3/2006 | Mead et al. .................... 174/69 |
| 2003/0026084 A1 | 2/2003 | Lauchner |
| 2004/0056155 A1 * | 3/2004 | Chen et al. .................... 248/49 |
| 2004/0108289 A1 * | 6/2004 | Chen et al. .................. 211/183 |

* cited by examiner

CABLE MANAGEMENT ARM ASSEMBLY

This application is a continuation-in-part of my currently pending application filed Dec. 20, 2004, Ser. No. 11/014,976, which is a continuation-in-part of my currently pending application filed Oct. 15, 2004, Ser. No. 10/964,708.

BACKGROUND OF THE INVENTION (a) Field of the Invention

The present invention relates to a cable management arm assembly, and more particularly, to one provided with a support rail movably connected to rear ends of telescoping slides to automatically move by following the telescoping slides and the expansion of a frame.

(b) Description of the Prior Art

For electronic products including servers stacked up in the storage space over the drawer type telescoping slides. Those slides are usually provided on both sides of the electronic product and allow the electronic product to slide on those slides while a cable management arm is made available to accommodate and contain cables connected to the electronic product.

As taught in U.S. Pat. Nos. 3,710,199; 4,353,518; 4,614,383; 5,460,441; 5,571,256; 5,893,539; 5,921,402; 6,070,742; 6,215,069 B1; 6,303,864 B1; 6,305,556 B1; 6,326,547 B1; 6,327,139 B1; 6,407,933 B1; 6,435,354 B1; 6,442,030 B1; 6,501,020 B2; 6,523,918 B1; 6,600,665 B2; 6,646,893 B1; 6,715,718 B1; 6,805,248 B2; 6,811,039 B2; 6,854,605 B2; 6,856,505 B1; 6,867,980 B2; 6,896,344 B2; 6,902,069 B2; 6,945,504 B2; and US Patent Application No 2003/0026084 A1, those cable management arm are adapted with slides having both ends of the cable management arm serving as supports. Those cable management arms are foldable by means of a folding member (usually a hinge) disposed between both ends, and the folding member is suspended to stay far away from either support when the cable management arm is folded.

Whereas the cables and the cable management arm of the prior art are given with inherited weight, the folding member provided on the cable management arm tends to droop, affecting the operation in an intensively stacked up storage space.

Furthermore, a cable management arm assembly operating in conjunction with slides characterized in that the slides help share the burden of the weight of the frame, prevent the frame from drooping at where the frame is folded and extend service life and allow easy operation as disclosed in Germany Patent No. DE202004019451U is an innovative improvement recently made by the same applicant.

SUMMARY OF THE INVENTION

The primary purpose of the present invention is to provide a cable management arm assembly operating in conjunction with slides that allows fast installation and easy subsequent operation by mounting in a rail connection fashion a cable management arm support mechanism that may slide into the slides.

To achieve the purpose, the present invention includes a frame, a support rail, a first and a second sliding members, a first and a second connectors and an insertion socket. The frame comprises a front arm and a rear arm pivoted to each other to slide on the support rail. Both ends of the frame are respectively connected to the insertion socket and the first connector. Both ends of the support rail are respectively connected to the first and second sliding members. The first and second sliding members are respectively received into the first and second connectors. A locking member is disposed on each of the first and second connectors and the insertion socket so as to lock them to the rear ends of outer rails and an inner rail of the slides. A limiting member is provided on the first connector connected to the frame to retain and release the first sliding member when the first sliding member is inserted into the first connector. Once the first connector is inserted to the rear end of the outer rail, the limiting member is pushed to swing so as to release the first sliding member for the support rail to move when the slides extend and the front and the rear arms of the frame unfold.

DETAILED DESCRIPTION OF THE PREFERRED EMBODIMENTS

Figure 14:
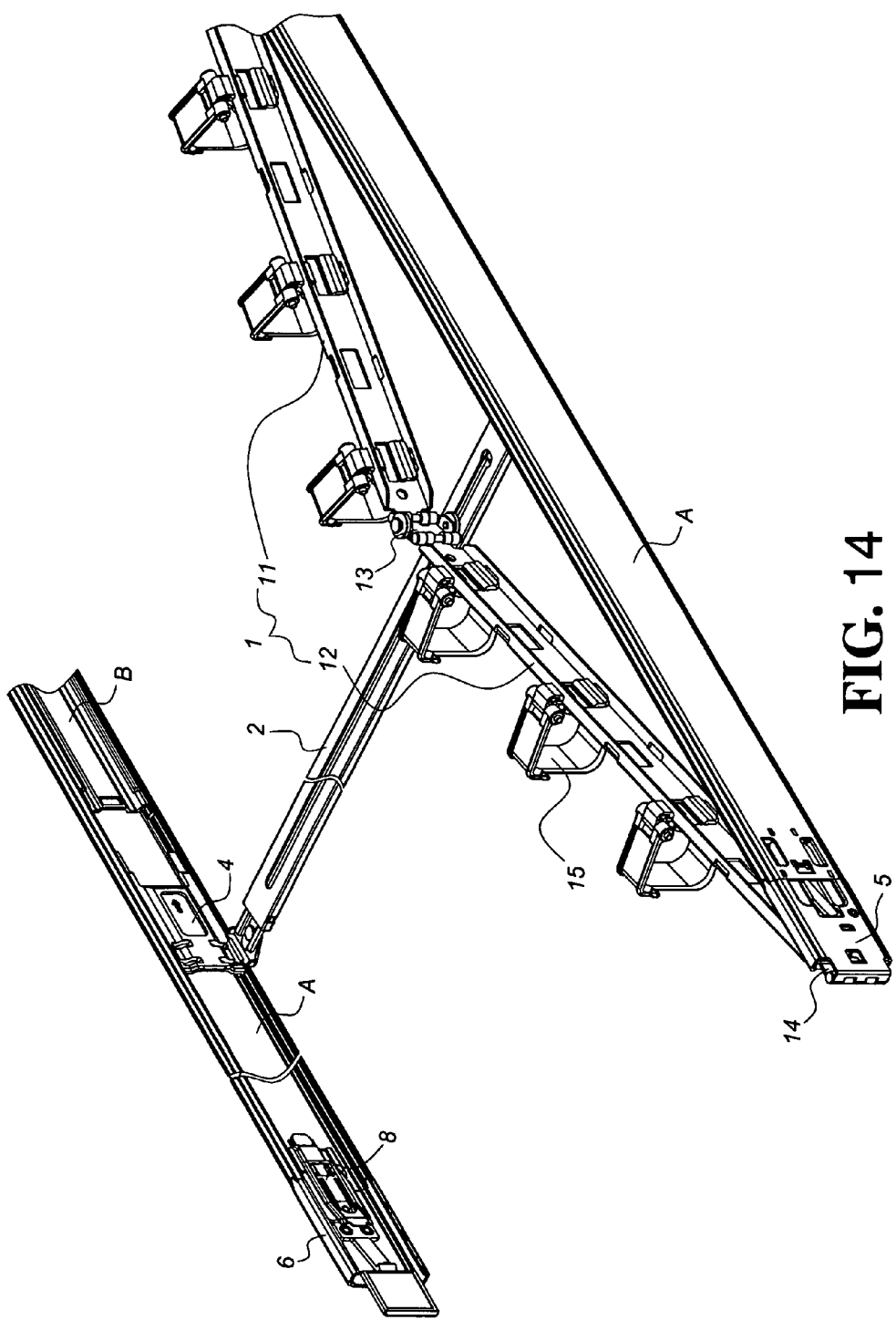
FIG. 14 is a schematic view showing the assembly of the preferred embodiment of the present invention in its extended status.
Figure 15:
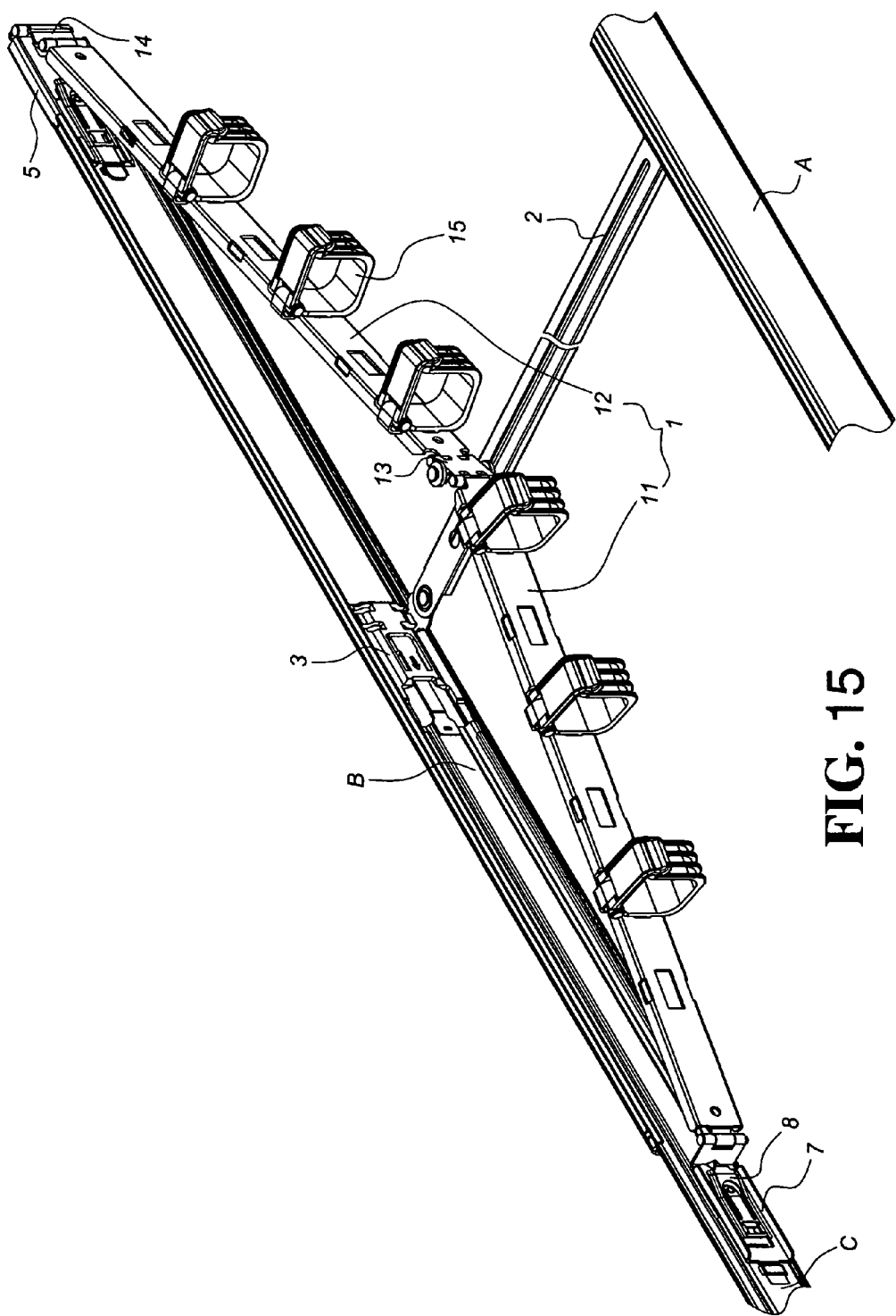
FIG. 15 is another schematic view showing the assembly of the preferred embodiment of the present invention in its extended status.

A preferred embodiment of the present invention is a cable management arm in conjunction with slides. The cable management arm may be assembled to the rear ends of outer rails and inner rails of the slides, and each of the slides is a three-section slide comprising an outer rail (A), a middle rail (B) and an inner rail (C), as illustrated in FIGS. 14 and 15.

Figure 1:
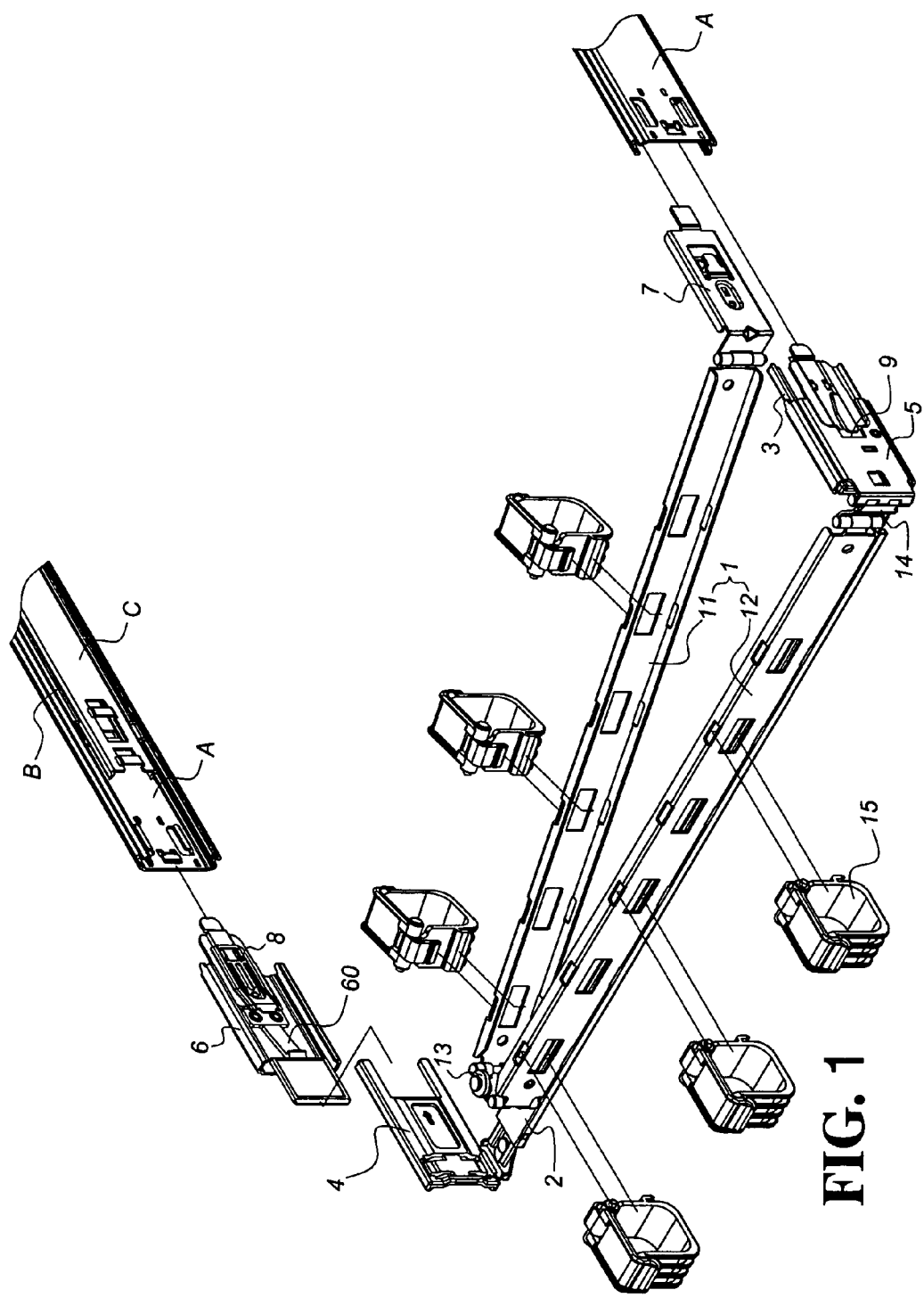
FIG. 1 is an exploded view of a preferred embodiment of the present invention.
Figure 2:
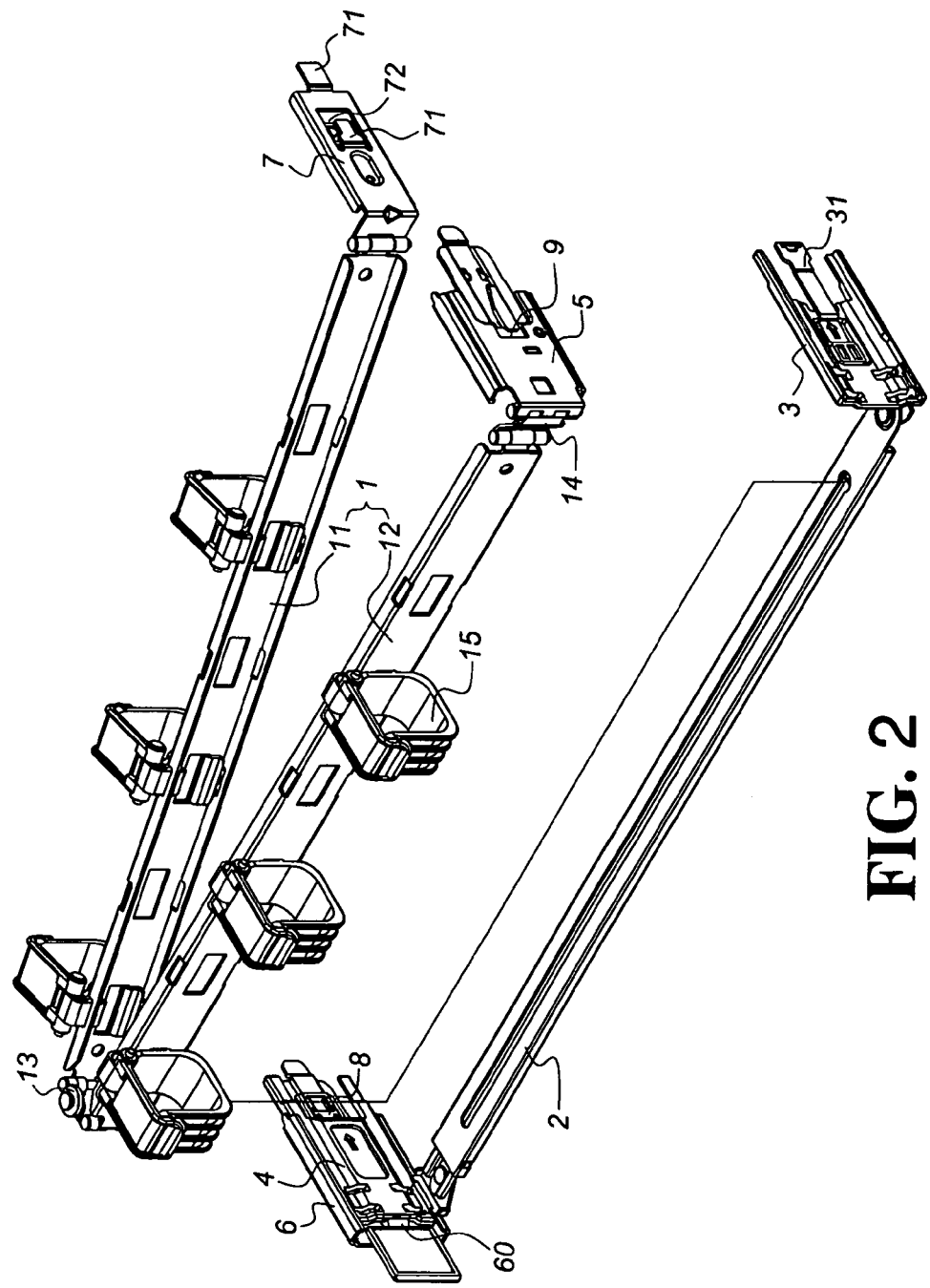
FIG. 2 is another exploded view of the preferred embodiment of the present invention.

Referring to FIGS. 1 and 2, the cable management arm includes a frame (1), a support rail (2), a first and a second sliding members (3, 4), a first and a second connectors (5, 6), and an insertion socket (7).

Figure 5:
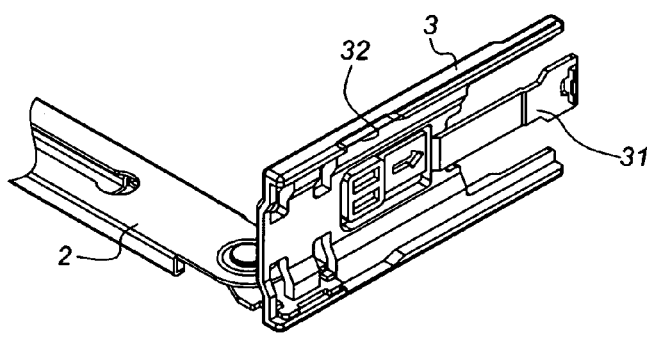
FIG. 5 is schematic view showing local members of the preferred embodiment of the present invention.

The frame (1) includes a front arm (11) and a rear arm (12). A pivot (13) is disposed between the front and the rear arms (11, 12) for the frame (1) to connect to and move on the support rail (2). Another end of the front arm (11) is pivotally connected to the insertion socket (7) and another end of the rear arm (12) is pivotally connected to the first connector (5) through a transferring member (14). A number of cable holders (15) are disposed on the front and the rear arms (11, 12). A locking member (8) is disposed on each of the first connector (5), the second connector (6) and the insertion socket (7) so as to secure them to the rear ends of the outer rails (A) and the inner rail (C). The first and second sliding members (3, 4) are respectively connected to both ends of the telescoping support rail (2). The first sliding member (3) is mounted in the first connector (5) in advance and contains a slot (32), as illustrated in FIG. 5, for positioning purpose and moves synchronously with the middle rail (B) with a hooking plate (31) extending from the first sliding member (3) to connect to the rear end of the middle tail (B). The second sliding member (4) moves as driven by the support rail (2) and is subject to the extension of the frame (1). The second sliding member (4) is mounted in the second connector (6) in advance. A positioning member (60) is provided on the second connector (6) to provide one-way retaining function so that the second sliding member (4) will not escape from the rear end of the second connector (6). The positioning member (60) permits elastic movement to release the second sliding member (4). Each rear end of the outer rail (A) and the inner rail (C) is disposed with a means for insertion.

Figure 3:
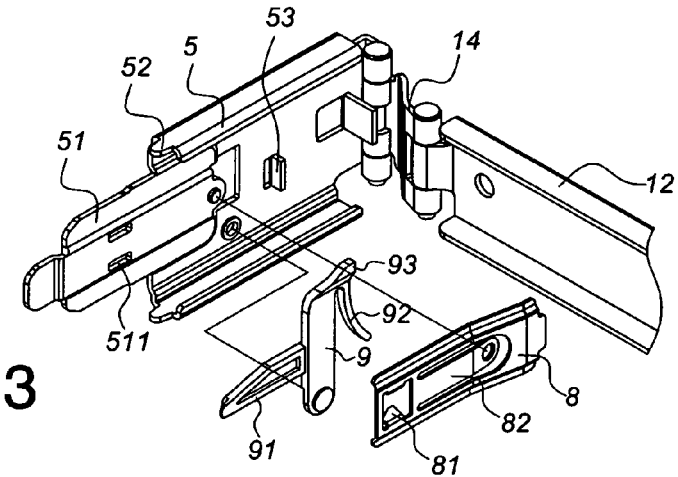
FIG. 3 is an exploded view showing local part of the preferred embodiment of the present invention.
Figure 4:
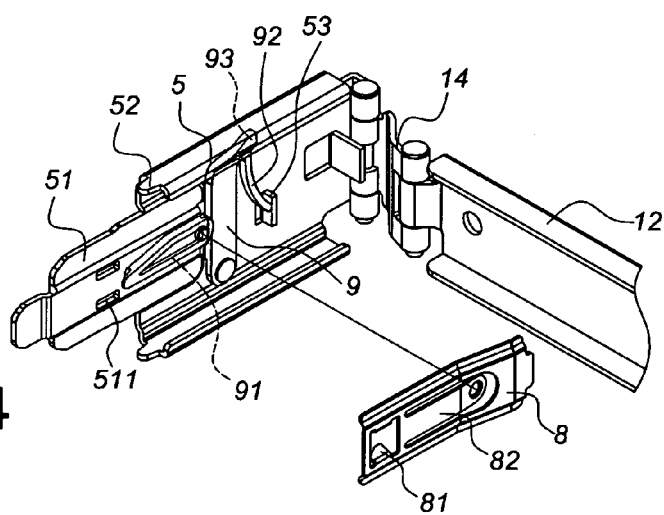
FIG. 4 is another exploded view showing local part of the preferred embodiment of the present invention.

Now referring to FIGS. 6, 7, 12, and 13, the cross-section of each of the first and second connectors (5, 6) is substantially in agreement with that of the outer rail (A) to facilitate abutting between the outer rail (A) and the first and second connectors (5, 6). Insertion portions (51, 61) extend from the first and second connectors (5, 6), respectively. Each of the insertion portions (51, 61) is provided with a folded portion and has a narrower front to be inserted into the rear end of the outer rail (A). Hooks (81) provided on the locking members (8) on the first and second connectors (5, 6) extend through holes (511, 611) of the insertion portions (51, 61). The first and second connectors (5, 6) are provided with tenons (52, 62) corresponding to recesses (A1) disposed on the outer rails (A) of the slides. The disposition of the tenons (52, 62) and the recess (A1) can be interchangeable. A limiting member (9) provided on the first connector (5) connected to the rear arm (12), as illustrated in FIGS. 3 and 4, elastically swings to be pivoted to the inner side of the first connector (5), and comprises a lever (91) to extend through the outer side of the first connector (5). The function of providing elastic swing of the limiting member (9) is achieved by extending an elastic rod (92) to hold against a protruding bit (53) disposed on the first connector (5) for providing a return force. The locking member (8) provided with the hooks (81) has an elastic arm (82) to be fixed to the first and second connectors (5, 6) and the insertion socket (7) [i.e., the first connector (5) as illustrated in FIGS. 3 and 4, and the same applies to other coordinating members]. The locking member (8) is made in an inclined and warped shape to define an end easy for pressing so as to raise the hooks (81) at the other end.

Figure 6:
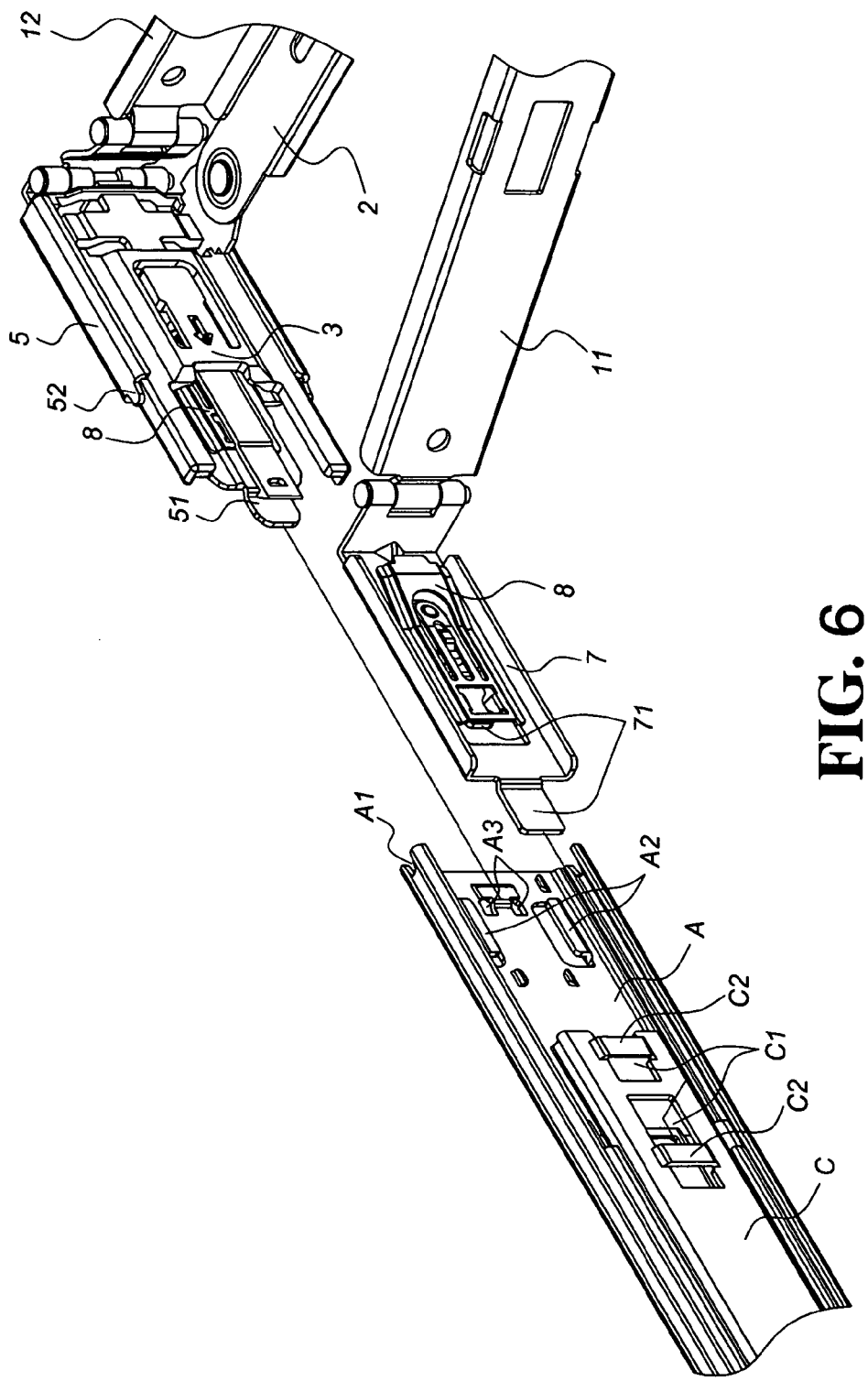
FIG. 6 is a schematic view showing local assembly members of the preferred embodiment of the present invention.
Figure 7:
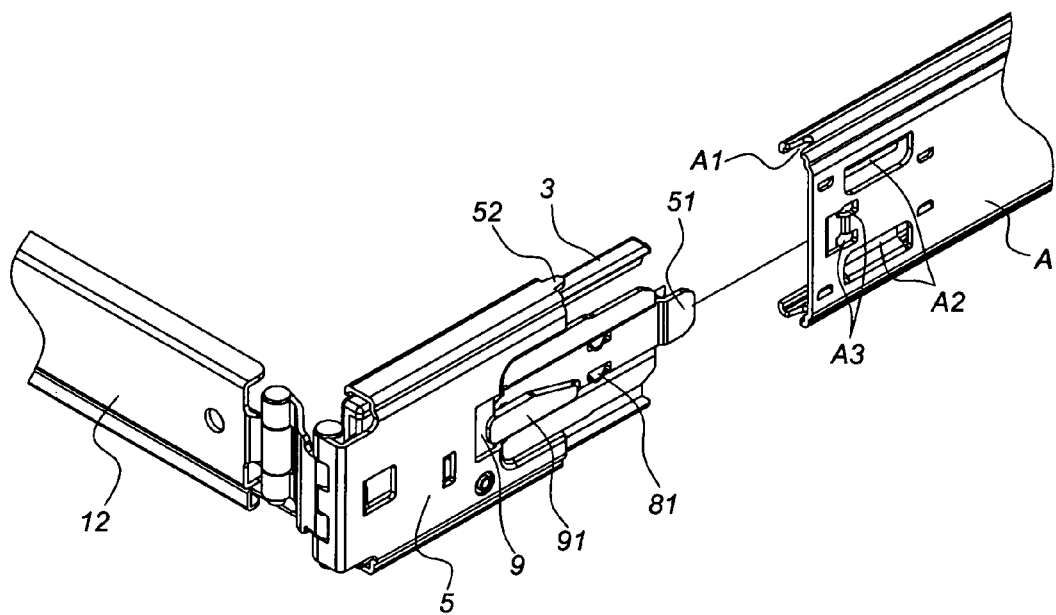
FIG. 7 is another schematic view showing local assembly members of the preferred embodiment of the present invention.
Figure 8:
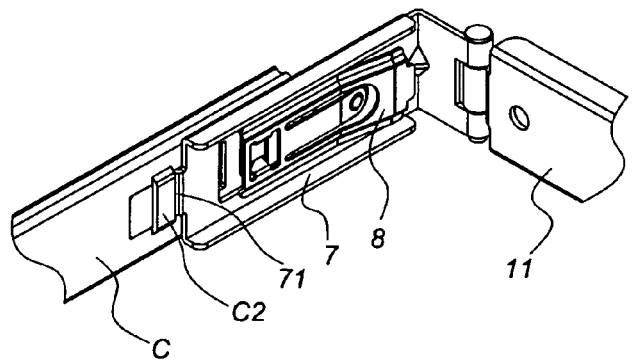
FIG. 8 is a first schematic view showing local assembly status of the preferred embodiment of the present invention.
Figure 12:
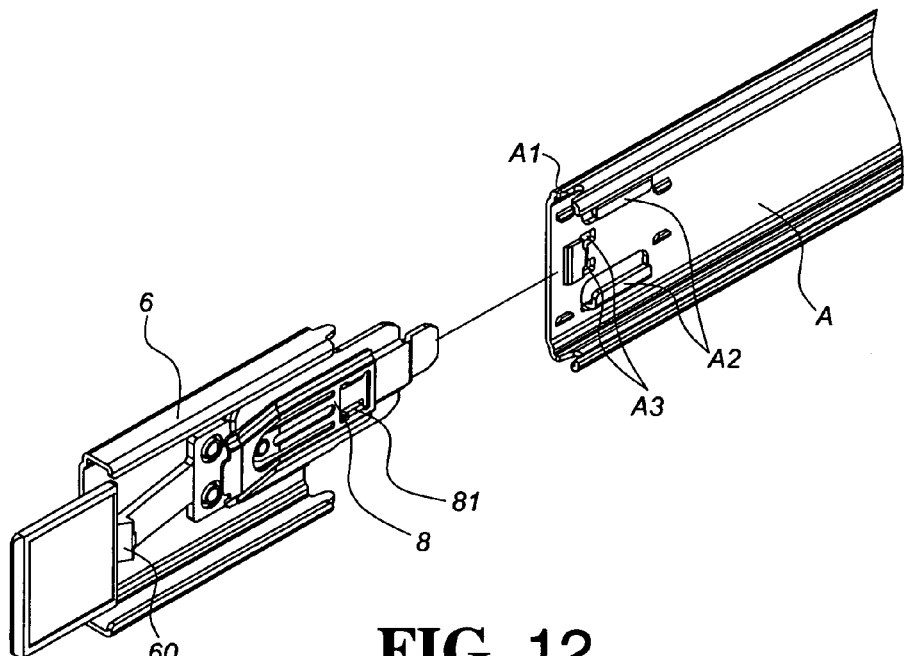
FIG. 12 is a fourth schematic view showing local assembly status of the preferred embodiment of the present invention.
Figure 13:
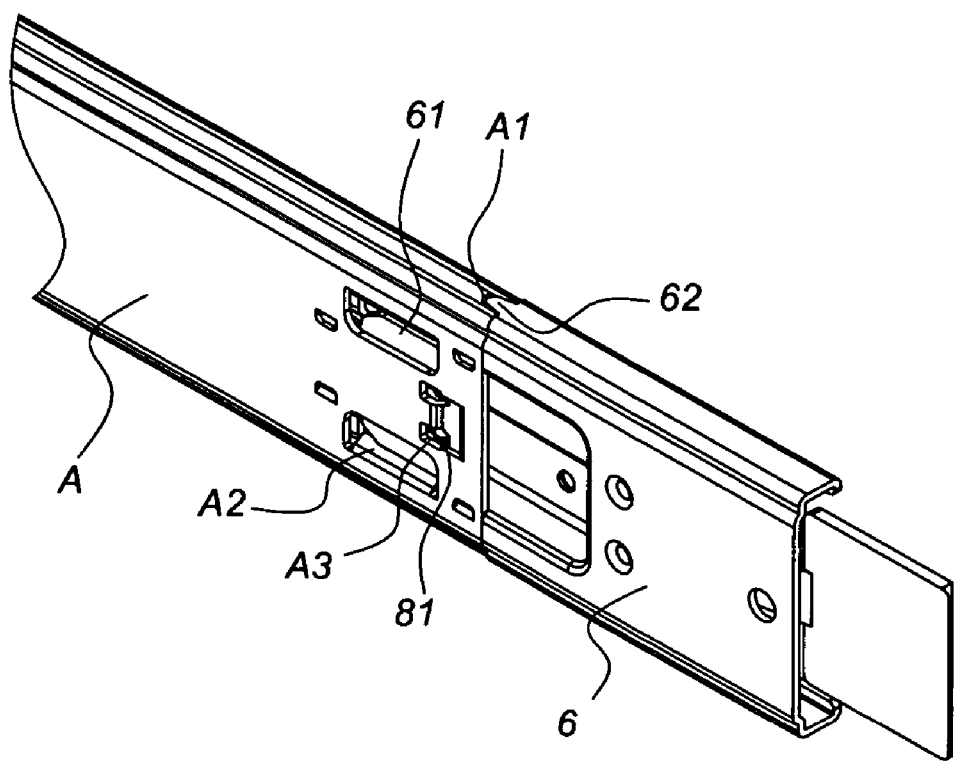
FIG. 13 is a fifth schematic view showing local assembly status of the preferred embodiment of the present invention.

Referring to FIGS. 6 and 12 showing the means for insertion of the rear ends of the outer rail (A) and the inner rail (C), retaining plates (A2) and retaining holes (A3) are disposed on the inner side at the rear end of the outer rail (A) so as to limit the insertion portions (51, 61) of the first and second connectors (5, 6) while the hooks (81) of the locking member (8) are engaged in the retaining holes (A3). Accordingly, the assembly is secured, as illustrated in FIGS. 7 and 13, in conjunction with the tenons (52, 62) and the recesses (A1). As illustrated in FIGS. 2, 6, and 8, openings (C1) and raised convexes (C2) are provided to the rear end of the inner rail (C). Bending insertion bits (71) and a slot (72) are provided on the insertion socket (7) for the insertion bits (71) to insert through the openings (C1) of the inner rail (C) to hold against the convexes (C2), and the hooks (81) of the locking member (8) pass through the slot (72) to hold against one of the openings (C1) adjacent to the convexes (C2) to secure the inner rail (C).

Figure 9:
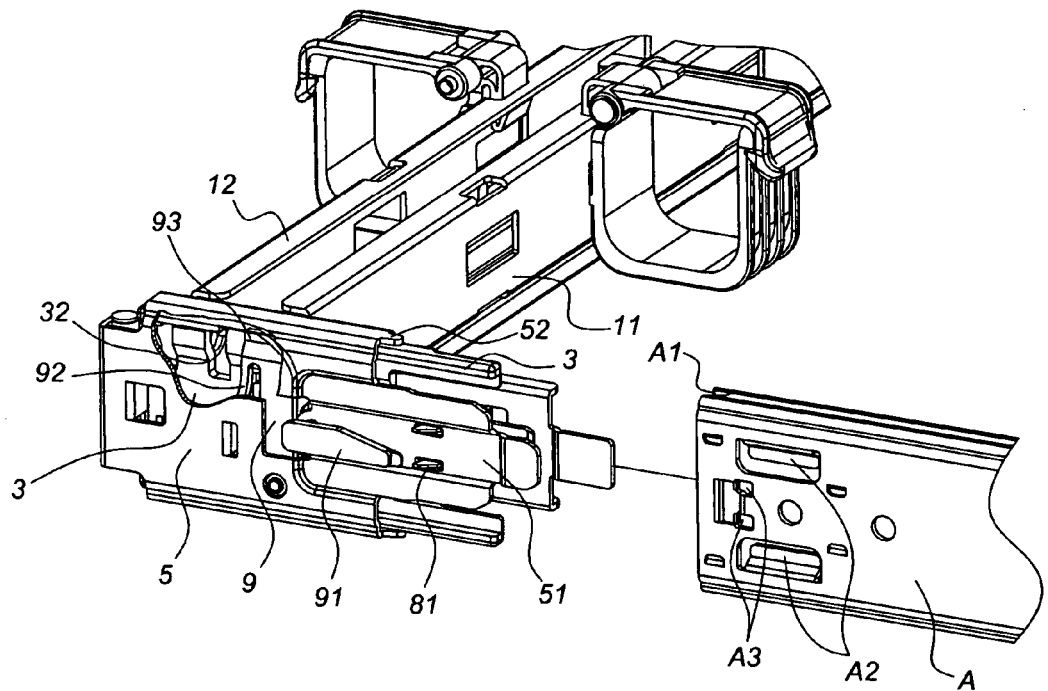
FIG. 9 is another schematic view showing local assembly members of the preferred embodiment of the present invention.
Figure 10:
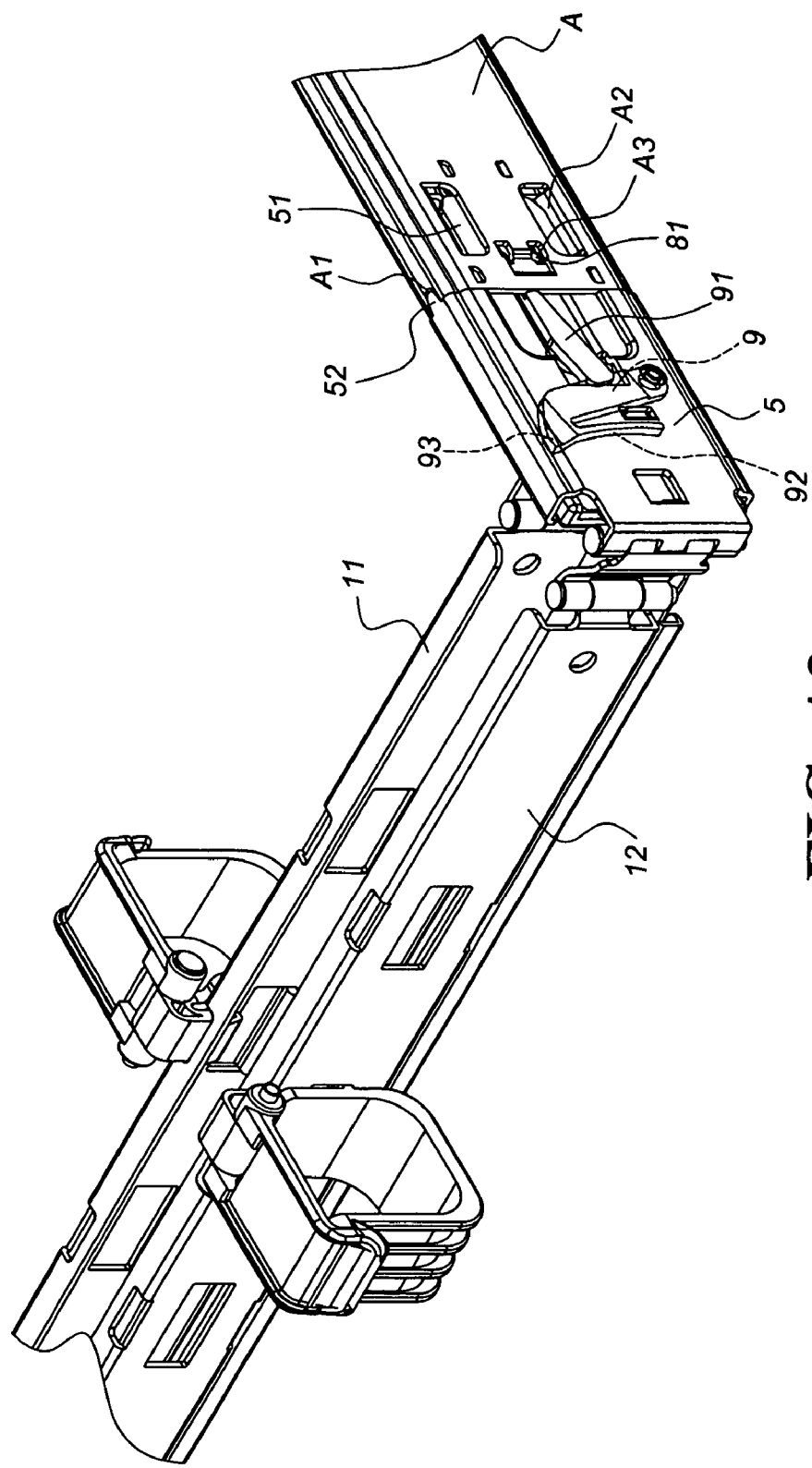
FIG. 10 is a second schematic view showing local assembly status of the preferred embodiment of the present invention.
Figure 11:
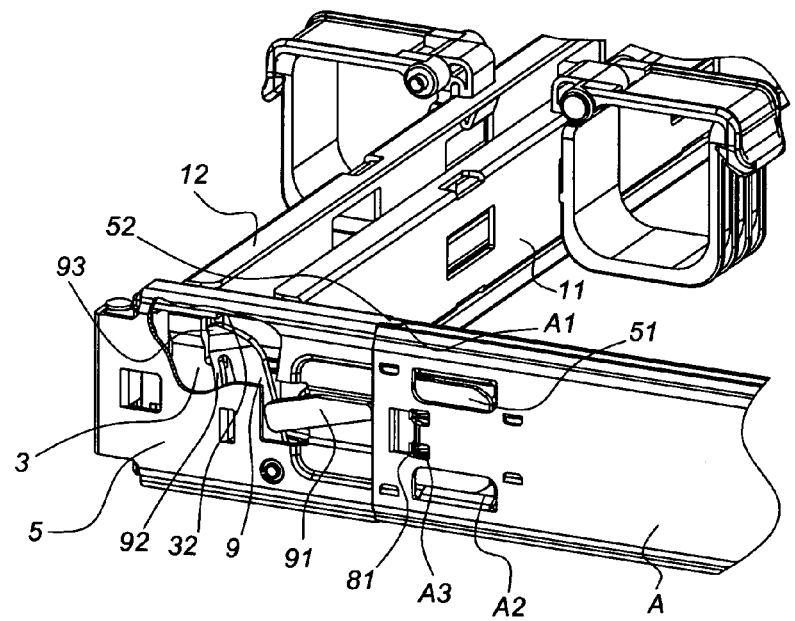
FIG. 11 is a third schematic view showing local assembly status of the preferred embodiment of the present invention.

Furthermore, to connect the first connector (5) mounted with the first sliding member (3) to the rear end of the outer rail (A) as illustrated in FIGS. 9, 10, and 11, an angular end (93) of the limiting member (9) protrudes to hold against the slot (32) of the first sliding member (3) to restrict the first sliding member (3) for facilitating the assembly when the first sliding member (3) is separately mounted in the first connector (5) in advance. Upon inserting the first connector (5) to the rear end of the outer rail (A), the lever (91) of the limiting member (9) holds against the end edge of the outer rail (A) to swing for the angular end (93) of the limiting member (9) to clear away from the slot (32) of the first sliding member (3). According, the first sliding member (3) is released to synchronously move along with the middle rail (B). By applying the assembly design in the pattern wherein the cable management arm operates depending on the extension of the slides as illustrated in FIGS. 14 and 15, the front arm (11), the rear arm (12) of the frame (1) and the support rail (2) smoothly spread up and move depending on the extension of the inner rail (C), the passive motion of the middle rail (B), and the sliding of the first and second sliding members (3, 4).

What is claimed is:

1. A cable management arm assembly including a frame, a support rail, a first and a second sliding members, a first and a second connectors, and an insertion socket operating in conjunction with slides; each slide being a three-section telescoping slide having an outer rail, a middle rail and an inner rail;

the frame comprising a front arm and a rear arm pivoted to each other to slide on the support rail; both ends of the frame being respectively connected to the insertion socket and the first connector; both ends of the support rail being connected to the first and second sliding members; the first and second sliding members being respectively mounted in the first and second connectors; a locking member being disposed on each of the first and second connectors and the insertion socket to secure them respectively to rear ends of the inner rail and the outer rails of the slides; a limiting member being disposed on the first connector connected to the frame to retain the first sliding member separately placed into the first connector; and the limiting member being pushed when the first connector is inserted into the rear end of the slide to release the first sliding member for the support rail connected with the first sliding member to move.

2. The cable management arm assembly of claim 1, wherein a pivot is disposed between the front and the rear arms of the frame, and the frame is connected to the support rail to slide by means of the pivot.

3. The cable management arm assembly of claim 1, wherein another end of the rear arm is connected to the first connector with a transferring member.

4. The cable management arm assembly of claim 1, wherein a number of cable holders are disposed on the front and the rear arms.

5. The cable management arm assembly of claim 1, wherein a slot is disposed in the first sliding member subject to the positioning by the limiting member.

6. The cable management arm assembly of claim 5, wherein the first sliding member moving synchronously with the middle rail is provided with a hooking plate to engage with the rear end of the middle rail.

7. The cable management arm assembly of claim 1, wherein a positioning member is disposed on the second connector not connected to the frame, the positioning member elastically moving to retain or release the second sliding member accommodated in the second connector.

8. The cable management arm assembly of claim 1, wherein tenons and recesses are disposed at end edges where the first and second connectors are abutted to the outer rails.

9. The cable management arm assembly of claim 1, wherein the limiting member is pivotally connected to an inner side of the first connector in an elastic swing status, and is disposed with a lever extending to reach an outer side of the first connector.

10. The cable management arm assembly of claim 9, wherein the elastic swing function of the limiting member is achieved by extending an elastic rod to hold against a protruding bit of the first connector.

11. A cable management arm assembly including a frame, a support rail, a first and a second sliding members, a first and a second connectors, and an insertion socket operating in conjunction with slides;
the frame comprising a front arm and a rear arm pivoted to each other to slide on the support rail; both ends of the frame being respectively connected to the insertion socket and the first connector; both ends of the support rail being connected to the first and second sliding members; the first and second sliding members being respectively mounted in the first and second connectors; a locking member being disposed on each of the first and second connectors and the insertion socket to secure them to the slides; and a limiting member being disposed on the first connector connected to the frame to retain or release the first sliding member accommodated in the first connector.

12. A cable management arm assembly including a frame, a support rail, a first and a second sliding members, a first and a second connectors, and an insertion socket operating in conjunction with slides;
the frame comprising a front arm and a rear arm pivoted to each other to slide on the support rail; both ends of the frame being respectively connected to the insertion socket and the first connector; both ends of the support rail being connected to the first and second sliding members; the first and second sliding members being respectively mounted in the first and second connectors; a locking member being disposed in each of the first and second connectors and the insertion socket to secure them to the slides; the first and second connectors being connected to rear ends of the slides; the first and second sliding members being guided into the slides; and the support rail connected with the sliding members moving as the slides extend and the frame spreads up.

13. The cable management arm assembly of claim 12, wherein a pivot is disposed between the front and the rear arms of the frame, and the frame is connected to the support rail to slide by means of the pivot.

14. The cable management arm assembly of claim 12, wherein another end of the rear arm is connected to the first connector with a transferring member.

15. The cable management arm assembly of claim 12, wherein a number of cable holders are disposed on the front and the rear arms.

16. The cable management arm assembly of claim 12, wherein a positioning member is disposed on the second connector not connected to the frame, the positioning member elastically moving to retain or release the second sliding member accommodated in the second connector.

17. The cable management arm assembly of claim 12, wherein an insertion portion extends from each of the first and second connectors, and the locking member is disposed with hooks to extend through holes of the insertion portion.

18. The cable management arm assembly of claim 12, wherein the locking member includes an elastic arm to be fixed to the first and second connectors, and the locking member is inclined and warped to define an end for pressing so as to raise the other end.

19. The cable management arm assembly of claim 12, wherein the locking member includes an elastic arm to be fixed to the insertion socket, and the locking member is inclined and warped to define an end for pressing so as to raise the other end.

20. The cable management arm assembly of claim 12, wherein retaining plates and retaining holes are disposed on an inner side of the rear end of each of the slides connected with the first and second connectors.

21. The cable management arm assembly of claim 12, wherein openings and raised convexes are disposed on the rear end of the slide connected with the insertion socket.

22. The cable management arm assembly of claim 12, wherein bending insertion bits and a slot are disposed on the insertion socket and hooks provided on the locking member disposed on the insertion socket penetrate through the slot.

23. The cable management arm assembly of claim 12, wherein tenons and recesses are provided at end edges where the first and second connectors and the rear ends of the slides are abutted to each other.

* * * * *